(12) United States Patent
Shao et al.

(10) Patent No.: US 8,557,710 B2
(45) Date of Patent: Oct. 15, 2013

(54) GAS CLUSTER ION BEAM ETCHING PROCESS FOR METAL-CONTAINING MATERIALS

(75) Inventors: Yan Shao, Andover, MA (US); Martin D. Tabat, Nashua, NH (US); Christopher K. Olsen, Peabody, MA (US); Ruairidh Maccrimmon, Arlington, MA (US)

(73) Assignee: TEL Epion Inc., Billerica, MA (US)

( * ) Notice: Subject to any disclaimer, the term of this patent is extended or adjusted under 35 U.S.C. 154(b) by 40 days.

(21) Appl. No.: 13/223,833

(22) Filed: Sep. 1, 2011

(65) Prior Publication Data
US 2013/0059444 A1    Mar. 7, 2013

(51) Int. Cl.
*H01L 21/302*    (2006.01)

(52) U.S. Cl.
USPC ........... 438/742; 438/709; 438/714; 438/720; 216/66

(58) Field of Classification Search
USPC ............. 438/706, 710, 712, 714, 719, 720, 7, 438/29, 662, 708, 709, 723, 738, 742; 216/58, 62, 66
See application file for complete search history.

(56) References Cited

U.S. PATENT DOCUMENTS

| | | | |
|---|---|---|---|
| 6,812,147 B2 | 11/2004 | Skinner | |
| 7,060,989 B2 | 6/2006 | Swenson et al. | |
| 7,071,122 B2 | 7/2006 | Saenger et al. | |
| 7,115,511 B2 | 10/2006 | Hautala | |
| 7,173,252 B2 | 2/2007 | Mack | |
| 7,709,344 B2 | 5/2010 | Chen et al. | |
| 7,759,251 B2 | 7/2010 | Geffken et al. | |
| 7,968,422 B2 * | 6/2011 | Hautala | 438/424 |
| 7,977,239 B2 | 7/2011 | Iwasaki | |
| 2002/0005676 A1 * | 1/2002 | Greer | 310/312 |
| 2002/0011760 A1 * | 1/2002 | Koshido | 310/312 |
| 2004/0060899 A1 | 4/2004 | Waldhauer et al. | |
| 2009/0305507 A1 | 12/2009 | Suzuki et al. | |
| 2010/0101940 A1 | 4/2010 | Ito et al. | |
| 2011/0117738 A1 * | 5/2011 | Russell et al. | 438/664 |

* cited by examiner

*Primary Examiner* — Lan Vinh
(74) *Attorney, Agent, or Firm* — Wood, Herron & Evans, LLP

(57) ABSTRACT

A method and system for performing gas cluster ion beam (GCIB) etch processing of metal-containing material is described. In particular, the GCIB etch processing includes forming a GCIB that contains a halogen element.

6 Claims, 9 Drawing Sheets

GAS CLUSTER ION BEAM ETCHING PROCESS FOR METAL-CONTAINING MATERIALS

BACKGROUND OF THE INVENTION

1. Field of Invention

The invention relates to gas cluster ion beam (GCIB) processing.

2. Description of Related Art

Typically, during fabrication of an integrated circuit (IC), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while etching another material at a substantially lesser rate. Furthermore, the success of the plasma etch process requires that acceptable profile control may be achieved while applying the etch process uniformly to the substrate.

In present IC devices, exotic materials have been introduced to replace conventional materials used in semiconductor processing, thereby improving various electrical properties of the IC devices. For example, in front-end-of-line (FEOL) semiconductor processing, high dielectric constant (high-k) materials are desirable for use as transistor gate dielectrics. Preliminary high-k materials used in this role were tantalum oxide and aluminum oxide materials. Currently, hafnium-based dielectrics and possibly lanthanum-based dielectrics are expected to enter production as gate dielectrics, thereby replacing the current silicon oxide and silicon oxynitride materials.

Furthermore, in FEOL semiconductor processing, metal-containing materials are desirable for use as transistor gate electrodes in future generations of electronic devices. Currently, metal electrodes containing Ti, Ta, and/or Al (e.g., TiN, TaN, $Al_2O_3$, and TiAl) are expected to enter production as metal electrodes, thereby fully or partly replacing the current polycrystalline silicon gate electrode.

Of course, the introduction of new materials to semiconductor processing is not limited to only FEOL operations, but is also a trend in metallization processes for back-end-of-line (BEOL) operations. Moreover, in advanced memory devices, new and exotic materials are used and introduced, including Fe, Co, Ni, and alloys thereof, as well as noble metals.

With current materials and the advent of these new materials in electronic device processing, the ability to etch these old and new materials while maintaining the integrity of pre-existing layers and/or structures faces formidable challenges. Conventional etch processes may not achieve practical etch rates of these materials or attain an acceptable etch selectivity relative to underlying or overlying materials. Moreover, conventional etch processes may not achieve acceptable profile control that is uniformly applied across the substrate.

SUMMARY OF THE INVENTION

Embodiments of the invention relate to GCIB processing. In particular, embodiments of the invention relate to GCIB etch processing. Furthermore, embodiments of the invention relate to GCIB etch processing of metal-containing material.

According to one embodiment, a method for etching metal-containing material on a substrate is described. The method includes maintaining a reduced-pressure environment around a substrate holder for holding a substrate having a surface, and holding the substrate securely within the reduced-pressure environment. The method further includes: forming a gas cluster ion beam (GCIB) from a pressurized gas mixture containing an etching gas that includes a halogen element selected from the group consisting of Cl and Br; accelerating the GCIB through the reduced-pressure environment; and irradiating the GCIB onto at least a portion of the surface of the substrate to etch a metal-containing material, wherein the metal-containing material includes a transition or post-transition metal selected from the group consisting of Sc, Y, Zr, Hf, Nb, V, Cr, Mo, Mn, Re, Fe, Co, Rh, Ni, Pd, Pt, Cu, Ag, Au, Zn, Cd, B, Al, Ga, In, and Sn.

According to another embodiment, a method for etching metal-containing material on a substrate is described. The method includes maintaining a reduced-pressure environment around a substrate holder for holding a substrate having a surface, and holding the substrate securely within the reduced-pressure environment. The method further includes: forming a gas cluster ion beam (GCIB) from a pressurized gas comprising an etching gas that includes two different halogen elements; accelerating the GCIB through the reduced-pressure environment; and irradiating the GCIB onto at least a portion of the surface of the substrate to etch a metal-containing material, wherein the metal-containing material includes a transition or post-transition metal.

According to another embodiment, a method for etching a chalcogenide on a substrate is described. The method includes maintaining a reduced-pressure environment around a substrate holder for holding a substrate having a surface, and holding the substrate securely within the reduced-pressure environment. The method further includes: forming a gas cluster ion beam (GCIB) from a pressurized gas mixture containing an etching gas including a halogen element; accelerating the GCIB through the reduced-pressure environment; and irradiating the GCIB onto at least a portion of the surface of the substrate to etch a chalcogenide on the substrate.

DETAILED DESCRIPTION OF SEVERAL EMBODIMENTS

Figure 1:
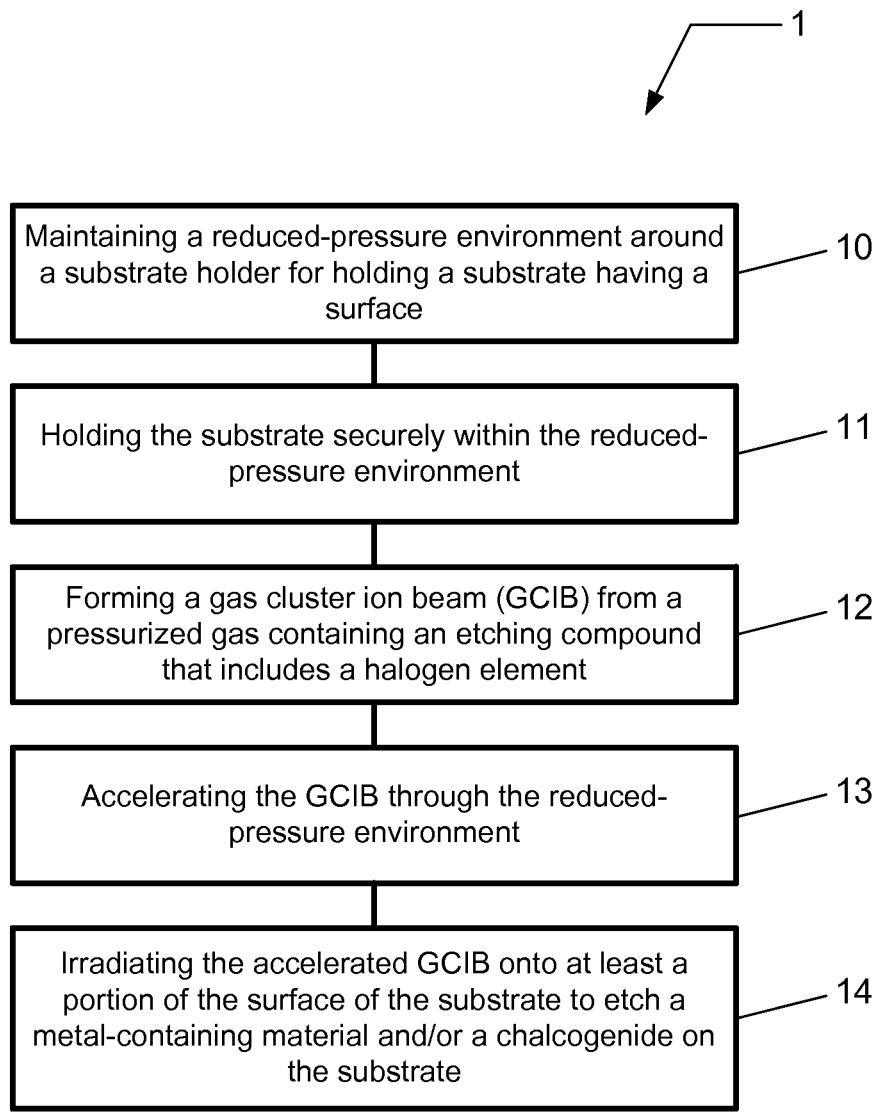
FIG. 1 is a flow chart illustrating a method for etching a substrate according to an embodiment.

Methods for etching layers, including silicon-containing, Ge-containing, metal-containing, and semiconductor layers, on a substrate using gas cluster ion beam (GCIB) processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described in part above, etch rate, etch selectivity, profile control, including CD (critical dimension) control, and surface roughness provide, among other process results, essential metrics for determining successful pattern etching. As an example, when transferring a feature pattern into a material layer on a substrate, it is important to selectively etch one material at a rate sufficient for adequate process throughput, while controlling the pattern profile and surface roughness of pattern surfaces as well as adjacent surfaces. Furthermore, it is important to control the etch rate, etch selectivity, and etch profile uniformly for all feature patterns formed in the material layer on the substrate, and/or spatially adjust the control of these parameters for feature patterns formed in the material layer on the substrate.

Therefore, according to various embodiments, methods for etching materials on a substrate, such as metal-containing material, semiconductor material, and/or chalcogenide material, are described. Referring now to the drawings wherein like reference numerals designate corresponding parts throughout the several views, FIG. 1 provides a flow chart 1 illustrating a method for etching metal-containing, semiconductor, and/or chalcogenide material on a substrate according to an embodiment. Furthermore, exemplary methods for etching a substrate are graphically depicted in FIGS. 2A and 2B.

Figure 2A:
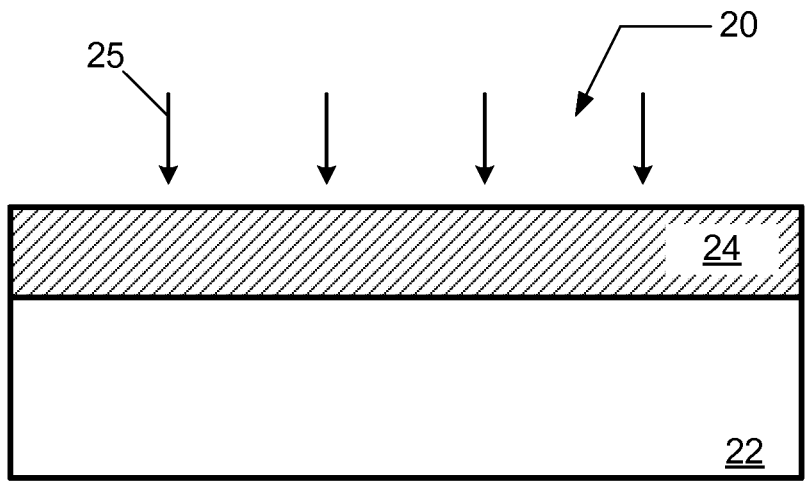
FIGS. 2A and 2B illustrate in schematic view methods for etching a substrate according to other embodiments.

As illustrated in FIG. 2A, a material layer 24 overlying at least a portion 20 of a substrate 22 may be etched using GCIB 25. Alternatively, as illustrated in FIG. 2B, a material layer 24' overlying at least a portion 20' of substrate 22 may be etched using GCIB 25' to transfer a first pattern 27 formed in a mask layer 26 to material layer 24' to produce a second pattern 28 therein.

Figure 2B:
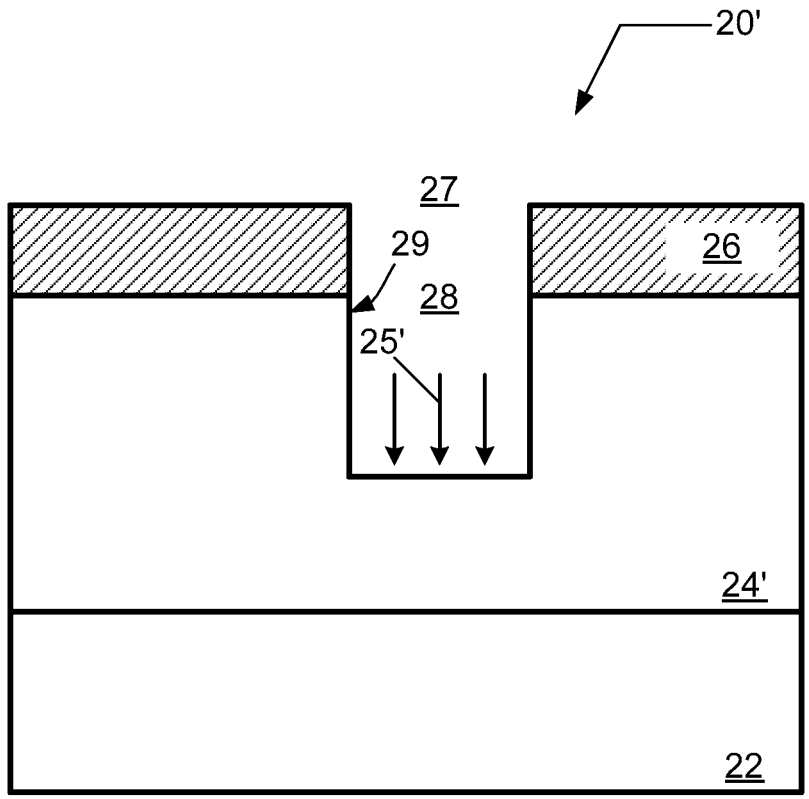

As illustrated in FIG. 2B, mask layer 26 having first pattern 27 formed therein is prepared on or above material layer 24'. The mask layer 26 may be formed by coating substrate 22 with a layer of radiation-sensitive material, such as photo-resist. For example, photo-resist may be applied to the substrate using a spin coating technique, such as those processes facilitated by a track system. Additionally, for example, the photo-resist layer is exposed to an image pattern using a photo-lithography system, and thereafter, the image pattern is developed in a developing solution to form a pattern in the photo-resist layer.

The photo-resist layer may comprise 248 nm (nanometer) resists, 193 nm resists, 157 nm resists, or EUV (extreme ultraviolet) resists. The photo-resist layer can be formed using a track system. For example, the track system can comprise a CLEAN TRACK ACT 8, ACT 12, or LITHIUS resist coating and developing system commercially available from Tokyo Electron Limited (TEL). Other systems and methods for forming a photo-resist film on a substrate are well known to those skilled in the art of spin-on resist technology.

The exposure to a pattern of electro-magnetic (EM) radiation may be performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

The developing process can include exposing the substrate to a developing solution in a developing system, such as a track system. For example, the track system can comprise a CLEAN TRACK ACT 8, ACT 12, or LITHIUS resist coating and developing system commercially available from Tokyo Electron Limited (TEL).

The photo-resist layer may be removed using a wet stripping process, a dry plasma ashing process, or a dry non-plasma ashing process.

The mask layer 26 may include multiple layers, wherein the pattern 27 formed in the mask layer 26 may be created using wet processing techniques, dry processing techniques, or a combination of both techniques. The formation of the mask layer 26 having a single layer or multiple layers is understood to those skilled in the art of lithography and pattern etching technology. Once pattern 27 is formed in mask layer 26, the mask layer 26 may be utilized to pattern underlying layers.

The method illustrated in flow chart 1 begins in 10 with maintaining a reduced-pressure environment around a substrate holder for holding substrate 22 having a surface in a gas cluster ion beam (GCIB) processing system. The GCIB processing system may include any one of the GCIB processing systems (100, 100' or 100") described below in FIG. 5, 6 or 7, or any combination thereof.

The method proceeds in 11 with holding substrate 22 securely within the reduced-pressure environment of the GCIB processing system. The temperature of substrate 22 may or may not be controlled. For example, substrate 22 may be heated or cooled during a GCIB treatment process. Additionally, the substrate 22 may include conductive materials, semi-conductive materials, or dielectric materials, or any combination of two or more thereof. For example, the substrate 22 may include a semiconductor material, such as silicon, silicon-on-insulator (SOI), germanium, or a combination thereof. Additionally, for example, the substrate 22 may include crystalline silicon.

Further, substrate 22 may include material layer (24, 24') on portion (20, 20') of substrate 22. Material layer (24, 24') may include a metal-containing material. The metal-containing material may include an alkali metal, an alkaline earth metal, a transition metal, a post-transition metal, a noble metal, or a rare earth metal. The metal-containing material may include a transition or post-transition metal selected from the group consisting of Sc, Y, Zr, Hf, Nb, Ta, V, Cr, Mo, W, Mn, Re, Fe, Ru, Co, Rh, Ni, Pd, Pt, Cu, Ag, Au, Zn, Cd, B, Al, Ga, In, and Sn. The metal-containing material may include a metal, a metal alloy, a metal oxide, a metal nitride, a metal carbide, a metal silicide, a metal germanide, a metal sulfide, etc.

Material layer (24, 24') may also include a semiconductor material. The semiconductor material may include a compound semiconductor, such as a III-V compound (e.g., GaAs, GaN, GaP, InAs, InN, InP, etc.), a II-V compound (e.g., $Cd_3P_2$, etc.), or a II-VI compound (e.g., ZnO, ZnSe, ZnS, etc.) (Groups II, III, V, VI refer to the classical or old IUPAC notation in the Periodic Table of Elements; according to the revised or new IUPAC notation, these Groups would refer to Groups 2, 13, 15, 16, respectively). Material layer (24, 24') may also include a chalcogenide (e.g., sulfides, selenides, tellurides).

In 12, a gas cluster ion beam (GCIB) is formed from a pressurized gas mixture containing an etching gas. The etching gas may include a halogen element. The etching gas may include a halogen element and one or more elements selected from the group consisting of C, H, N, and S.

For example, the etching gas may include $F_2$, $Cl_2$, $Br_2$, $NF_3$, or $SF_6$. Additionally, for example, the etching gas may include a halide, such as HF, HCl, HBr, or HI. Furthermore, for example, the etching gas may include a halomethane, such as a mono-substituted halomethane (e.g., $CH_3F$, $CH_3Cl$, $CH_3Br$, $CH_3I$), a di-substituted halomethane (e.g., $CH_2F_2$, $CH_2ClF$, $CH_2BrF$, $CH_2FI$, $CH_2Cl_2$, $CH_2BrCl$, $CH_2ClI$, $CH_2Br_2$, $CH_2BrI$, $CH_2I_2$), a tri-substituted halomethane (e.g., $CHF_3$, $CHClF_2$, $CHBrF_2$, $CHF_2I$, $CHCl_2F$, $CHBrClF$, $CHClFI$, $CHBr_2F$, $CHBrFI$, $CHFI_2$, $CHCl_3$, $CHBrCl_2$, $CHCl_2I$, $CHBr_2Cl$, $CHBrClI$, $CHClI_2$, $CHBr_3$, $CHBr_2I$, $CHBrI_2$, $CHI_3$), or a tetra-substituted halomethane (e.g., $CF_4$, $CClF_3$, $CBrF_3$, $CF_3I$, $CCl_2F_2$, $CBrClF_2$, $CClF_2I$, $CBr_2F_2$, $CBrF_2I$, $CF_2I_2$, $CCl_3F$, $CBrCl_2F$, $CCl_2FI$, $CBr_2ClF$, $CBrClFI$, $CClFI_2$, $CBr_3F$, $CBr_2FI$, $CBrFI_2$, $CFI_3$, $CCl_4$, $CBrCl_3$, $CCl_3I$, $CBr_2Cl_2$, $CBrCl_2I$, $CCl_2I_2$, $CBr_3Cl$, $CBr_2ClI$, $CBrClI_2$, $CClI_3$, $CBr_4$, $CBr_3I$, $CBr_2I_2$, $CBrI_3$, $CI_4$).

To form the GCIB, constituents of the etching gas should be selected that exist in a gaseous phase either alone or in combination with a carrier gas (e.g., a noble gas element or nitrogen) at relatively high pressure (e.g., a pressure of one atmosphere or greater).

In one embodiment, when etching a metal-containing material, the etching gas includes a halogen element selected from the group consisting of Cl and Br. The etching gas may further include C, or H, or both C and H. For example, the etching gas may include a halide or a halomethane. Additionally, for example, the etching gas may include $Cl_2$, $Br_2$, HCl, HBr, $CClF_3$, $CBrF_3$, $CHClF_2$, or $C_2ClF_5$, or any combination of two or more thereof.

In another embodiment, when etching a metal-containing material, the etching gas includes two different halogen elements. A first halogen element may be selected from the group consisting of Cl and Br, and the second halogen element may include F. The etching gas may further include C, or H, or both C and H. For example, the etching gas may include a halomethane. Additionally, for example, the etching gas may include $CClF_3$, $CBrF_3$, $CHClF_2$, or $C_2ClF_5$, or any combination of two or more thereof.

In yet another embodiment, when etching a chalcogenide material, the etching gas includes a halogen element. For example, the etching gas may include a halide or halomethane. Additionally, for example, the etching gas may include $F_2$, $Cl_2$, $Br_2$, HF, HCl, HBr, $NF_3$, $SF_6$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

The pressurized gas mixture may further include a compound containing a halogen element; a compound containing F and C; a compound containing H and C; or a compound containing C, H, and F, or any combination of two or more thereof. Additionally, the pressurized gas mixture may further include a chlorine-containing compound, a fluorine-containing compound, or a bromine-containing compound. Additionally, the pressurized gas mixture may further include a compound containing one or more elements selected from the group consisting of C, F, H, Cl, and Br. Additionally yet, the pressurized gas mixture may further include a silicon-containing compound, a germanium-containing compound, a nitrogen-containing compound, an oxygen-containing compound, or a carbon-containing compound, or any combination of two or more thereof. Furthermore, the pressurized gas mixture may further include one or more elements selected from the group consisting of B, C, H, Si, Ge, N, P, As, O, S, F, Cl, and Br. Further yet, the pressurized gas mixture may further include He, Ne, Ar, Kr, Xe, $O_2$, CO, $CO_2$, $N_2$, NO, $NO_2$, $N_2O$, $NH_3$, $F_2$, HF, $SF_6$, or $NF_3$, or any combination of two or more thereof.

Even further yet, the GCIB may be generated from a pressurized gas mixture that includes at least one dopant, or film forming constituent for depositing or growing a thin film, or any combination of two or more thereof.

In another embodiment, the GCIB may be generated by alternatingly and sequentially using a first pressurized gas mixture containing an etch gas and a second pressurized gas mixture containing a film forming gas. In yet other embodiments, a composition and/or a stagnation pressure of the GCIB may be adjusted during the etching.

In 13, the GCIB is accelerated through the reduced pressure environment towards substrate 22 according to a beam acceleration potential. For the GCIB, the beam acceleration potential may range up to 100 kV, the beam energy may range up to 100 keV, the cluster size may range up to several tens of thousands of atoms, and the beam dose may range up to about $1 \times 10^{17}$ clusters per $cm^2$. For example, the beam acceleration potential of the GCIB may range from about 1 kV to about 70 kV (i.e., the beam energy may range from about 1 keV to about 70 keV, assuming an average cluster charge state of unity). Additionally, for example, the beam dose of the GCIB may range from about $1 \times 10^{12}$ clusters per $cm^2$ to about $1 \times 10^{14}$ clusters per $cm^2$.

The GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

In 14, the accelerated GCIB is irradiated onto at least a portion of the surface of substrate 22 to etch a Si-containing material and/or a Ge-containing material on substrate 22. To achieve target etch process metrics, such as etch rate, etch selectivity, roughness control, profile control, etc., the GCIB may be generated by performing the following: selecting a beam acceleration potential, one or more beam focus potentials, and a beam dose; accelerating the GCIB according to the beam acceleration potential; focusing the GCIB to according to the one or more beam focus potentials; and irradiating the accelerated GCIB onto at least a portion of the substrate according to the beam dose.

Furthermore, in addition to these GCIB properties, a beam energy, a beam energy distribution, a beam angular distribution, a beam divergence angle, a stagnation pressure, a stagnation temperature, a mass flow rate, a cluster size, a cluster size distribution, a beam size, a beam composition, a beam electrode potential, or a gas nozzle design (such as nozzle throat diameter, nozzle length, and/or nozzle divergent section half-angle) may be selected. Any one or more of the aforementioned GCIB properties can be selected to achieve control of target etch process metrics, such as those noted above. Furthermore, any one or more of the aforementioned GCIB properties can be modified to achieve control of target etch process metrics, such as those noted above.

Figure 3A:
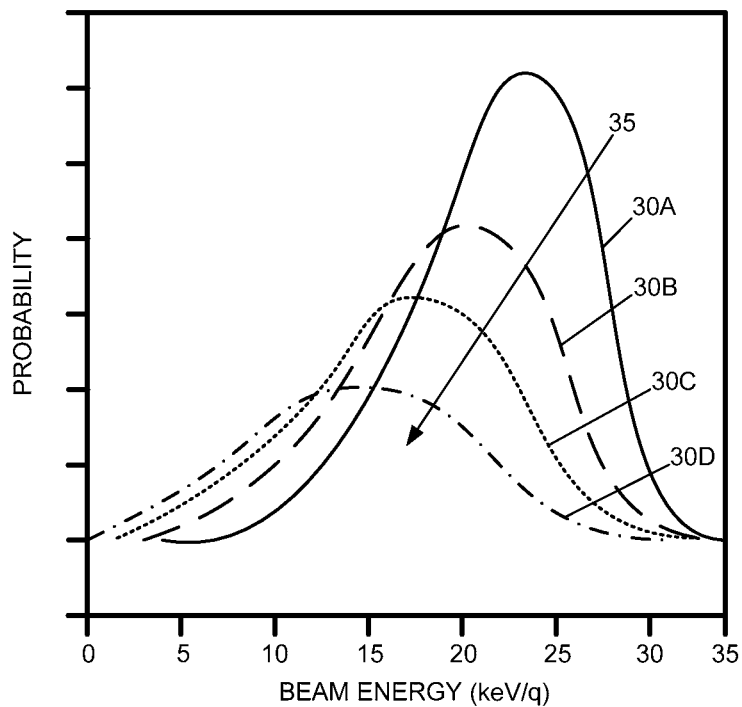
FIG. 3A provides a schematic graphical illustration of a beam energy distribution function for a GCIB.

In FIG. 3A, a schematic graphical illustration of a beam energy distribution function for a GCIB is illustrated. For example, FIG. 3A graphically illustrates several beam energy distributions (30A, 30B, 30C, 30D), wherein the peak beam energy decreases and the energy distribution broadens as one proceeds through the distributions in direction 35.

The beam energy distribution function for the GCIB may be modified by directing the respective GCIB along a GCIB path through an increased pressure region such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the GCIB may be modified by modifying or altering a charge state of the respective GCIB. For example, the charge state may be modified by adjusting an electron flux, an electron energy, or an electron energy distribution for electrons utilized in electron collision-induced ionization of gas clusters.

Figure 3B:
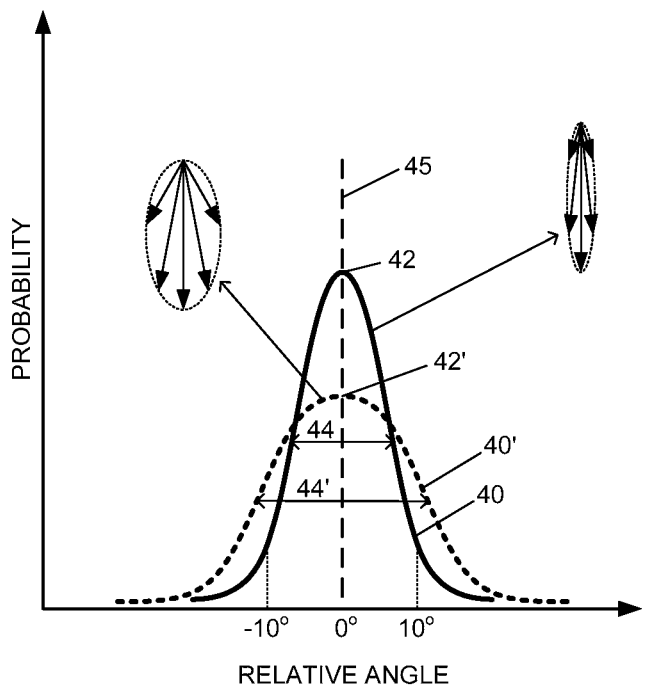
FIG. 3B provides a schematic graphical illustration of a beam angular distribution function for a GCIB.

In FIG. 3B, a schematic graphical illustration of a beam angular distribution function for a GCIB is illustrated. For example, FIG. 3B graphically illustrates a first beam angular distribution function 40 characterized by a first peak 42 at a direction of incidence 45 (i.e., relative angle is 0°) and a first width 44 (e.g., a full-width at half maximum (FWHM)). Additionally, for example, FIG. 3B illustrates a second beam angular distribution function 40' characterized by a second peak 42' at the direction of incidence 45 (i.e., relative angle is 0°) and a second width 44' (e.g., a full-width at half maximum (FWHM)). The first beam angular distribution function 40 represents a narrow distribution (or a relatively narrower beam divergence angle), while the second beam angular distribution function 40' represents a relatively broader distribution (or a relatively broader beam divergence angle). Hence, the directionality of the GCIB relative to normal incidence on the substrate may be adjusted by altering the beam angular distribution function (e.g., changing the angular distribution between the first angular distribution function 40 and the second angular distribution function 40'). The beam angular distribution function or beam divergence angle may be modified using the aforementioned techniques described for modifying the beam energy distribution function.

According to another embodiment, in addition to irradiation of substrate 22 with the GCIB, another GCIB may be used for additional control and/or function. Irradiation of the substrate 22 by another GCIB, such as a second GCIB, may proceed before, during, or after use of the GCIB. For example, another GCIB may be used to dope a portion of the substrate 22 with an impurity. Additionally, for example, another GCIB may be used to modify a portion of the substrate 22 to alter properties of substrate 22. Additionally, for example, another GCIB may be used to etch a portion of the substrate 22 to remove additional material from substrate 22. Additionally, for example, another GCIB may be used to clean a portion of the substrate 22 to remove additional material or residue, such as halogen-containing residue, from substrate 22. Additionally yet, for example, another GCIB may be used to grow or deposit material on a portion of the substrate 22. The doping, modifying, etching, cleaning, growing, or depositing may comprise introducing one or more elements selected from the group consisting of He, Ne, Ar, Xe, Kr, B, C, Se, Te, Si, Ge, N, P, As, O, S, F, Cl, and Br.

According to another embodiment, the at least one portion (20, 20', 20") of substrate 22 subjected to GCIB irradiation may be cleaned before or after the irradiating with the GCIB.

For example, the cleaning process may include a dry cleaning process and/or a wet cleaning process. Additionally, the at least one portion (20, 20', 20") of substrate 22 subjected to GCIB irradiation may be annealed after the irradiating with the GCIB.

According to another embodiment, when preparing substrate 22, any portion of substrate 22 or the feature pattern 28 may be subjected to corrective processing. During corrective processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

Figure 4:
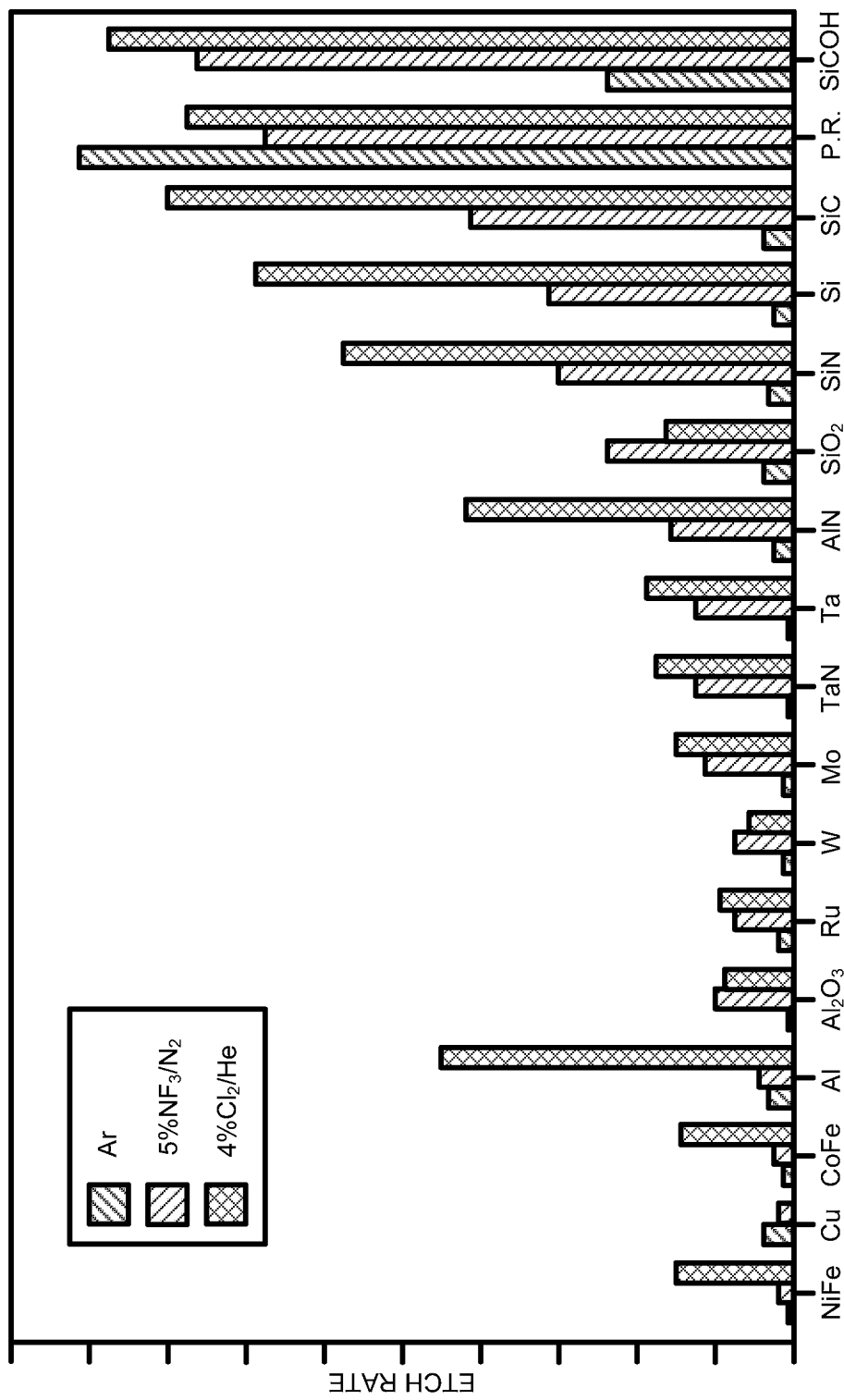
FIG. 4 graphically depict exemplary data for etching material on a substrate.

Turning now to FIG. 4, exemplary data for etching material on a substrate is graphically depicted. FIG. 4 is a bar graph of etch rate of several materials, including NiFe, Cu, CoFe, Al, $Al_2O_3$, Ru, W, Mo, TaN, Ta, AlN, $SiO_2$, SiN, Si, SiC, photoresist (P.R.), and SiCOH, for three (3) GCIB etch processes. The GCIB processes include: (A) Ar; (B) 5% $NF_3/N_2$; and (C) 4% $Cl_2$/He. The GCIB process conditions for the three (3) GCIB etch processes are provided in Table 1.

In Table 1, each GCIB process condition provides a GCIB composition, a beam acceleration potential (kV), a P-Cell value that relates to modification of the beam energy distribution function, and a flow rate of the GCIB composition (in sccm, standard cubic centimeters per minute). Concerning the GCIB composition, the notation "5% $NF_3/N_2$" represents the relative amount (mol/mol %) of $NF_3$ in $N_2$. Concerning the P-Cell value, as described above, the P-Cell value is related to a flow rate (sccm) of a background gas introduced to an increased pressure region to cause collisions between the GCIB and the background gas and, thus, broadening of the beam energy distribution function. For example, the pressure in the pressure cell, through which the GCIB traverses, is raised by introducing a background gas at a flow rate of 40 sccm (P-Cell value of "40") (or a pressure-distance integral of about 0.005 torr-cm) to the pressure cell.

TABLE 1

| GCIB Process Condition | GCIB Composition | Beam Acceleration Potential (kV) | P-Cell | Flow Rate (sccm) |
|---|---|---|---|---|
| A | Ar | 30 | 0 | 250 |
| B | 5%NF$_3$/N$_2$ | 30 | 0 | 500 |
| C | 4%Cl$_2$/He | 30 | 0 | 700 |

As illustrated in FIG. 4, the etch rate of several metal-containing materials, such as CoFe, NiFe, and Al, tends to improve when using a Cl-based GCIB chemistry, as opposed to a F-based GCIB chemistry. Also, when the GCIB contains only Ar, as in GCIB process condition "A", the etch rate is driven by a purely physical component, e.g., sputtering. However, FIG. 4 and Table 1 suggest that the GCIB composition may be selected to provide a chemical component to the etch process, and an increase in the etch rate.

Figure 5:
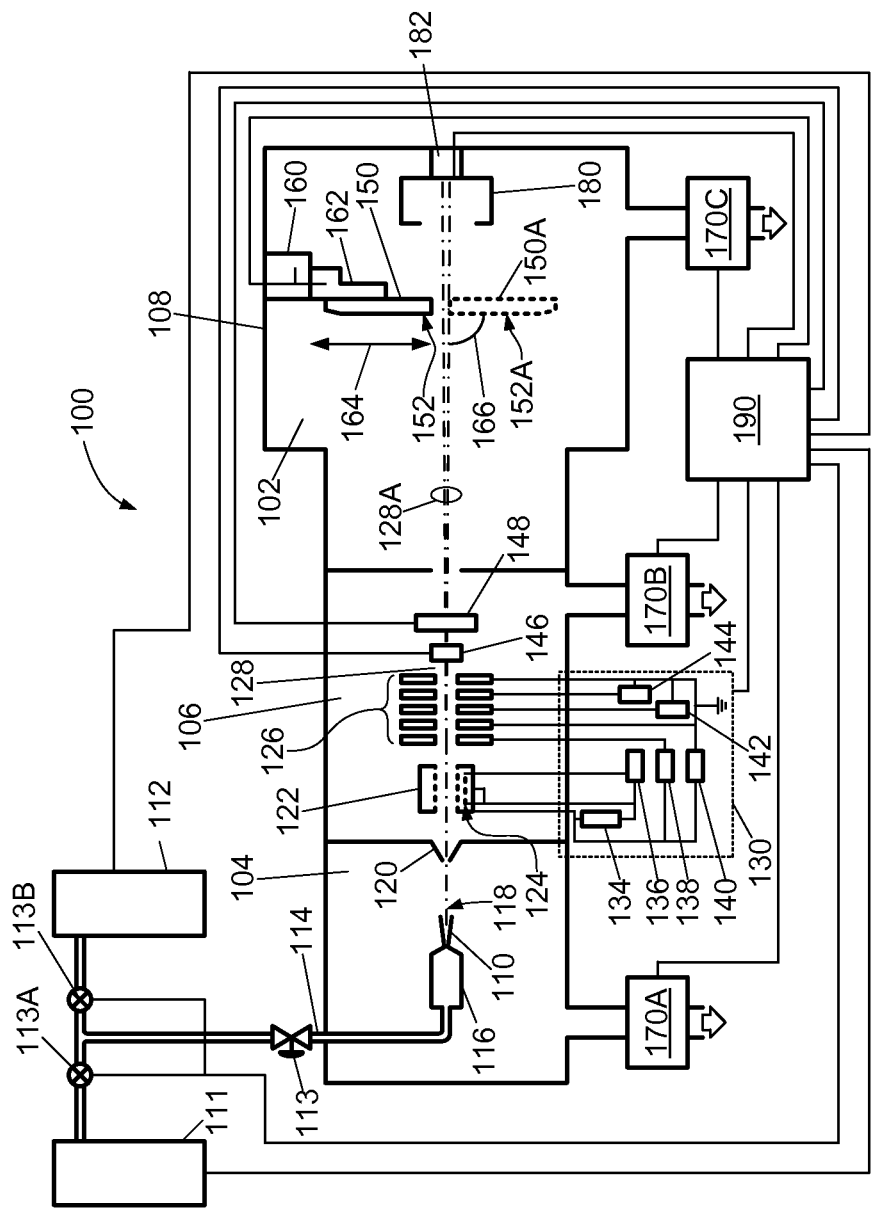
FIG. 5 is an illustration of a GCIB processing system.

Referring now to FIG. 5, a GCIB processing system 100 for treating a substrate as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The GCIB processing system 100 may also include multiple nozzles with one or more skimmer openings. Additional details concerning the design of a multiple gas cluster ion beam system are provided in U.S. Patent Application Publication No. 2010/0193701 A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 4, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 4, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
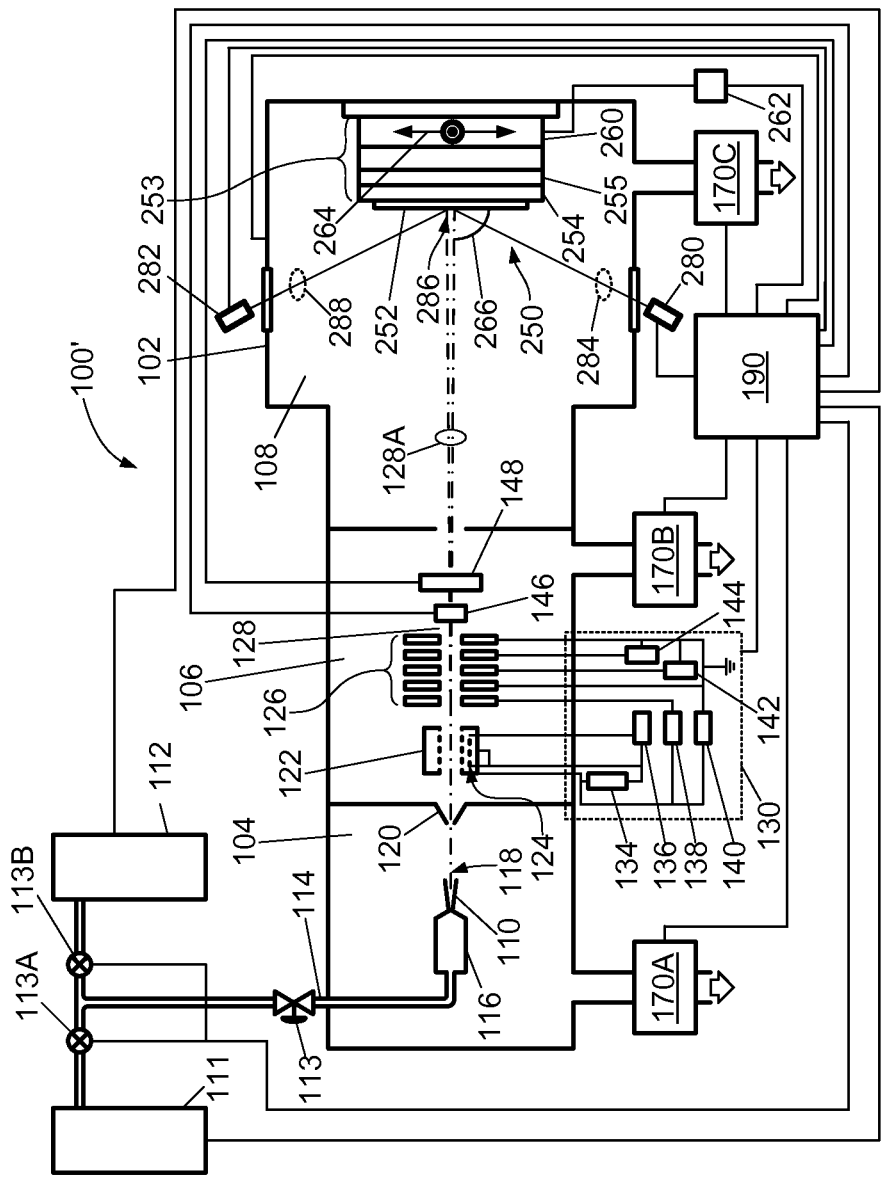
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 7:
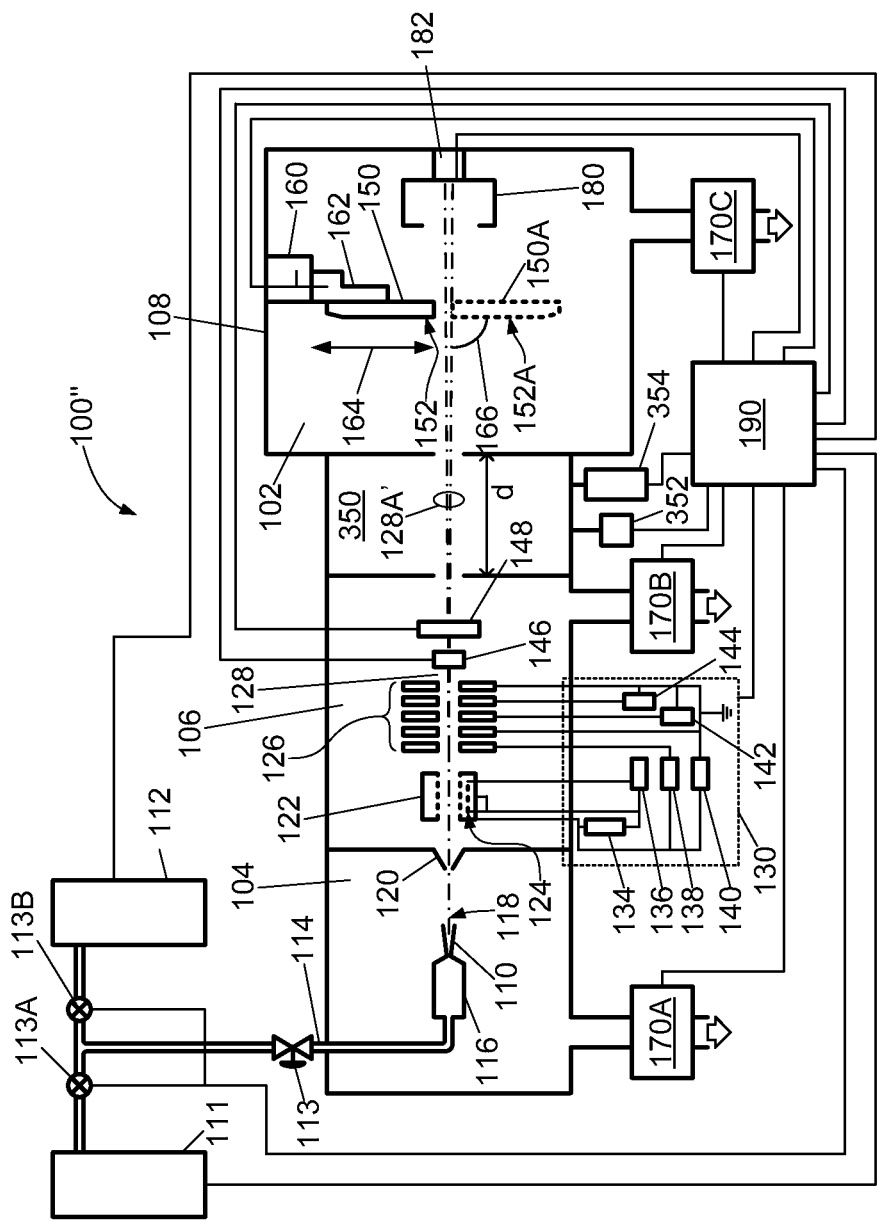
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region.

The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
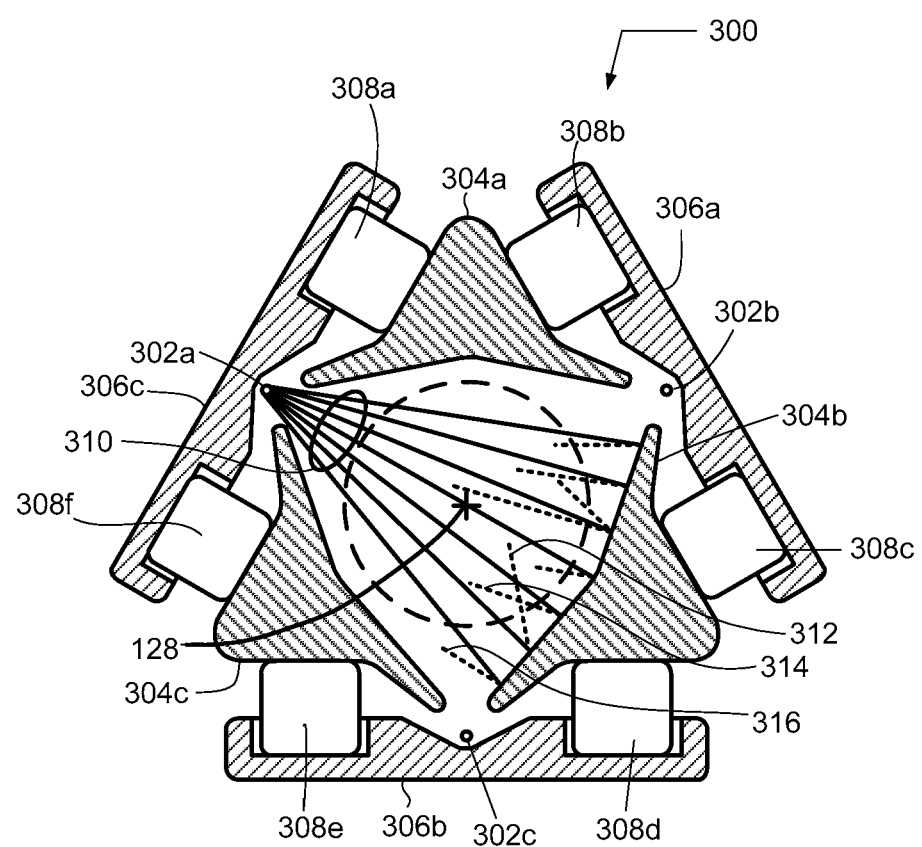
FIG. 8 is an illustration of an ionization source for a GCIB processing system.

Referring now to FIG. 8, a section 300 of an ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 9:
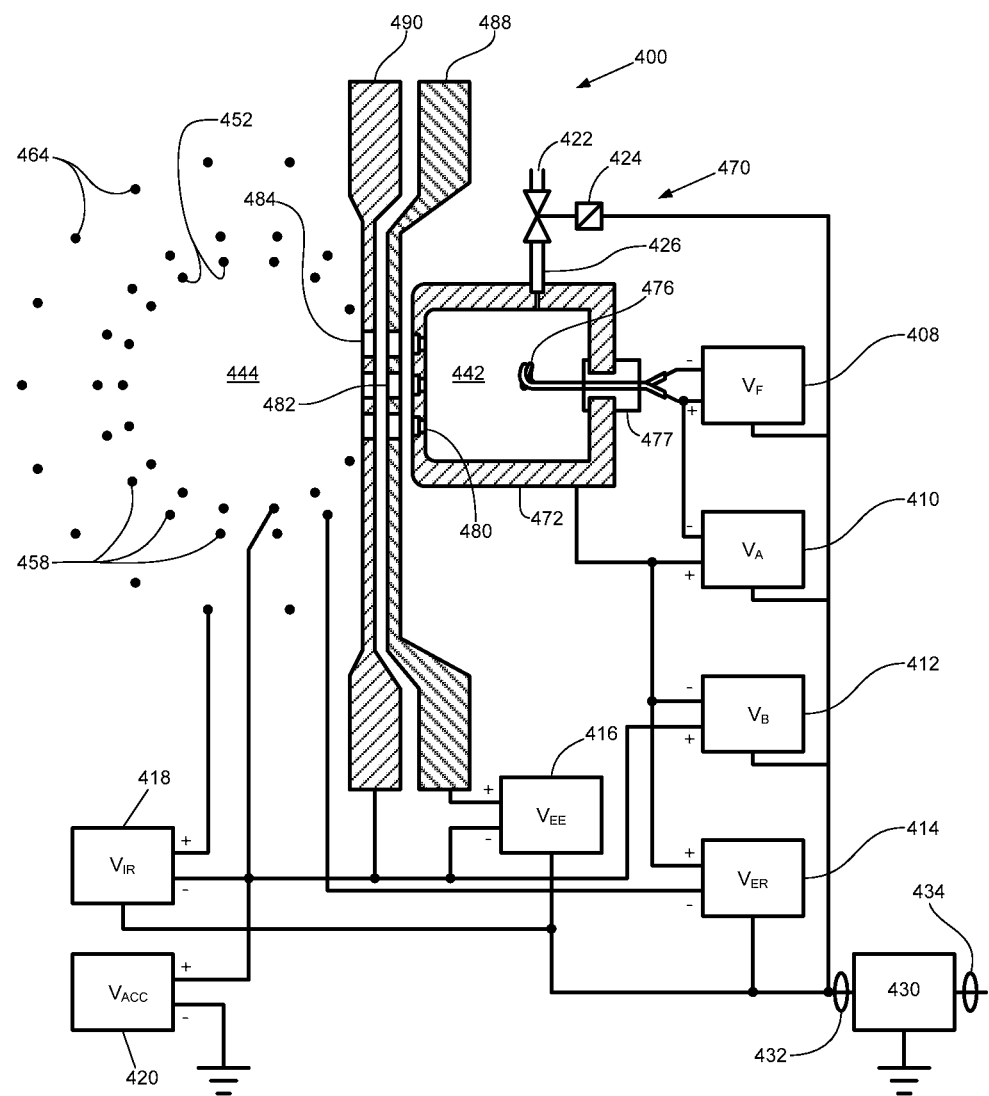
FIG. 9 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 9, a section 400 of an ionizer (122, FIGS. 5, 6 and 7) for ionizing a gas cluster jet (gas cluster beam 118, FIGS. 5, 6 and 7) is shown. The section 400 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 5, 6 and 7). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 5, 6 and 7). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 5, 6 and 7).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The ionizer (122, FIGS. 5, 6 and 7) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for etching metal-containing material on a substrate, comprising:
   maintaining a reduced-pressure environment around a substrate holder for holding a substrate having a surface;
   holding said substrate securely within said reduced-pressure environment;
   forming a gas cluster ion beam (GCIB) from a pressurized gas comprising an etching gas that includes a mono-substituted halomethane, a di-substituted halomethane, a tri-substituted halomethane, or a tetra-substituted halomethane substituted with two different halogen elements, or any combination of two or more thereof;
   accelerating said GCIB through said reduced-pressure environment; and
   irradiating said accelerated GCIB onto at least a portion of said surface of said substrate to etch a metal-containing material on said substrate,
   wherein said metal-containing material includes a transition or post-transition metal.

2. The method of claim 1, wherein said etching gas includes $CClF_3$, $CBrF_3$, $CHClF_2$, or $C_2ClF_5$.

3. The method of claim 1, wherein said pressurized gas mixture further comprises He, Ne, Ar, Kr, Xe, $O_2$, CO, $CO_2$, $N_2$, NO, $NO_2$, $N_2O$, $NH_3$, $F_2$, HF, $SF_6$, or $NF_3$, or any combination of two or more thereof.

4. The method of claim 1, wherein said etching gas includes $CHF_3$ or $CH_3F$.

5. The method of claim 1, wherein said metal-containing material on said substrate is W, Ti, Ta, or Ru.

6. The method of claim 1, wherein said metal-containing material on said substrate is W.

* * * * *